(12) United States Patent
Penberthy et al.

(10) Patent No.: US 10,264,647 B1
(45) Date of Patent: Apr. 16, 2019

(54) ADAPTABLE CONTROL APPARATUS INDICATORS FOR AN ELECTRIC POWER DELIVERY SYSTEM

(71) Applicant: Schweitzer Engineering Laboratories, Inc., Pullman, WA (US)

(72) Inventors: Evan J. Penberthy, Moscow, ID (US); Thomas Allen Stanley, Pullman, WA (US); Cole Salo, Butte, MT (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 16/101,990

(22) Filed: Aug. 13, 2018

(51) Int. Cl.
| | | |
|---|---|---|
| *H05B 33/08* | (2006.01) | |
| *H05B 37/02* | (2006.01) | |
| *H02H 7/20* | (2006.01) | |
| *G01R 31/08* | (2006.01) | |

(52) U.S. Cl.
CPC ......... *H05B 33/0857* (2013.01); *G01R 31/08* (2013.01); *H02H 7/20* (2013.01); *H05B 37/02* (2013.01)

(58) Field of Classification Search
CPC .......................... H05B 33/0857; H05B 37/02
See application file for complete search history.

(56) References Cited

U.S. PATENT DOCUMENTS

| | | |
|---|---|---|
| 6,271,759 B1 | 8/2001 | Weinbach |
| 8,474,994 B2 | 7/2013 | Campman |
| 9,892,692 B2 | 2/2018 | Nageli |

OTHER PUBLICATIONS

NKK Switches. (n.d.). Programmable Switches. Retrieved May 10, 2018 from https://www.nkkswitches.com/products/oled-lcd-programmables/.

*Primary Examiner* — Joseph L Williams
(74) *Attorney, Agent, or Firm* — Richard M. Edge

(57) ABSTRACT

Described herein are adaptable control apparatus indicators for dedicated operations of a device for operating an electric power delivery system. The control apparatus indicators may be buttons on an intelligent electronic device (IED) used for the dedicated operations of opening and closing a circuit breaker of the electric power delivery system. The colors of the control apparatus indicators may be configurable by a user upon configuration of the IED.

20 Claims, 6 Drawing Sheets

US 10,264,647 B1

ADAPTABLE CONTROL APPARATUS INDICATORS FOR AN ELECTRIC POWER DELIVERY SYSTEM

RELATED APPLICATION (None)

TECHNICAL FIELD

This disclosure relates to adaptable control apparatus indicators for an electric power delivery system. More particularly, this disclosure relates to user programmable indicators on depression surfaces for operating electric power delivery system equipment.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
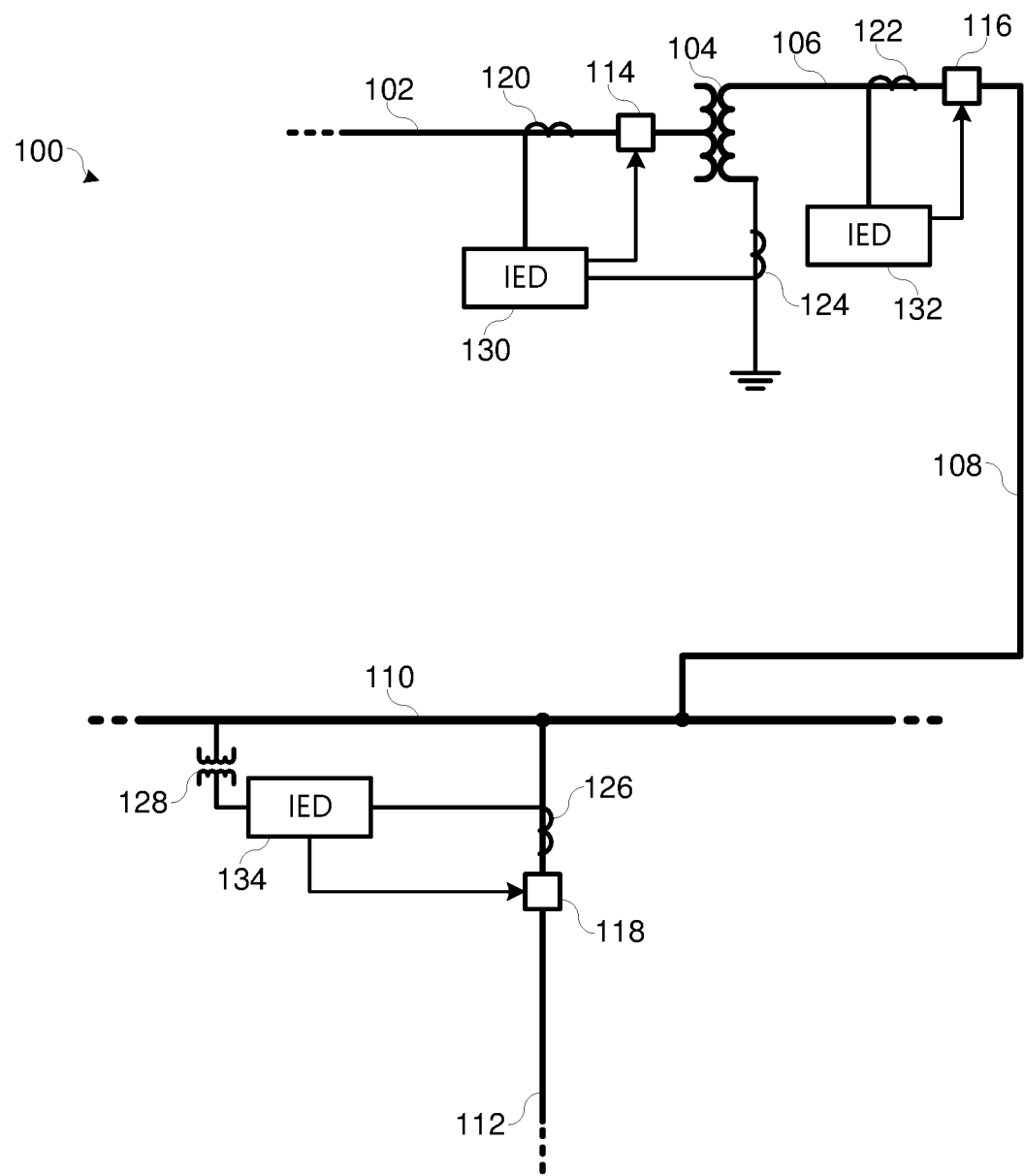
FIG. 1 illustrates a simplified one-line diagram of an electric power delivery system including various monitoring devices.

Electric power delivery systems include primary equipment for generating, transforming, transmitting, conditioning, and delivering electric power to loads. Such primary equipment may be monitored and operated using intelligent electronic devices (IEDs), which obtain electric power system signals from the primary equipment, perform monitoring operations, and provide control actions to the primary equipment. For example, an IED may obtain current and/or voltage signals from a portion of the electric power delivery system, determine a condition of the electric power delivery system from the electric power system signals, and send a command to operate (e.g. open or close a circuit breaker) primary equipment based on the determined condition. In certain embodiments, the commands and operations may be opening and closing of a switch or circuit breaker. In other embodiments, the commands and operations may be starting and stopping of a motor. In various embodiments, the commands of start/stop of an electric motor may be performed by closing/opening a switch or circuit breaker to apply or remove electric power from the electric motor. Various other commands and operations are applicable.

IEDs may include a human-machine interface (HMI) that includes a plurality of interactive components that may be used to interact with the IED. The HMI may be integral to the IED or separate from the IED. The HMI may be disposed on a face of the IED. The HMI may include a screen, buttons, status indicators, communication ports, and the like. Several IEDs include an open button that when depressed causes the IED to signal a switch (such as a circuit breaker) to open, and a close button that when depressed causes the IED to signal the switch to close.

Opening and closing a switch may connect and disconnect electric power from a portion of the electric power delivery system. Depressing the appropriate button for the desired operation is important so that the desired operation is undertaken. Because the action of opening and closing a switch may result in energization or de-energization of a portion of the electric power system, it is quite important that the appropriate button is depressed, and the appropriate action is undertaken. For example, if a maintenance operation is planned for a particular portion of the electric power delivery system, the switch must be opened to remove electric power from that portion of the system. To open the switch, the appropriate button must be depressed to open the switch.

In various different establishments, different colors have different meanings for the open and close buttons. For example, in certain establishments, red is used to signify an open button, and green is used to signify a close button; whereas in other establishments, red is used to signify a close operation, and green is used to signify an open operation. Establishments may refer to different political regions, countries, utilities, states, electrical interconnections, companies, standards, and the like.

Typically, at the request of customers, IED manufacturers produce different IEDs, different HMI overlays, or the like to cater to the requests of customers who have specific requirements for the colors of the open and close buttons. What is needed is adaptability of the color displayed on buttons associated with dedicated operations. Accordingly, the embodiments described herein disclose an IED with dedicated operation buttons that have adaptable display.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be implemented as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of machine-readable media suitable for storing electronic and/or processor executable instructions.

FIG. 1 illustrates a simplified one-line diagram of an electric power delivery system 100 and various IEDs configured to monitor the electric power delivery system. Although the electric power delivery system is illustrated as a single phase, the embodiments herein equally apply to more complex and multi-phase electric power delivery systems. As illustrated, the electric power delivery system includes a transmission line 102 that may lead to a transformer 104 that transforms electric power from a transmission voltage to a distribution voltage. Distribution line 106 may carry electric power to a distribution bus 110. Feeder 112 may distribute electric power from the distribution bus 110 to loads. The electric power delivery system 100 may be monitored by IEDs 130, 132, and 134. IED 130 is configured to monitor and effect operations on the transformer 104. To that end, IED 130 may obtain electric power signals from the transmission line 120 using, for example, current transformer (CT) 120 and from the transformer 104 using CT 124. IED 130 may obtain other signals from the electric power delivery system using, for example, potential transformers (PTs), equipment status, signals from other IEDs, and so forth. Using the obtained signals, the IED 130 may determine a status of the monitored equipment, and operate circuit breaker 114 based on the determined status. IED 130 may further be configured to operate circuit breaker 114 based on a received command (e.g. a command from an HMI of the IED, a command from a supervisory system, a command from another IED, or the like). For example, the IED 130 may determine a fault condition on the transformer 104 based on a differential of the current signals from CT 120 and CT 124, and signal circuit breaker 114 to open based on the detected fault condition.

Similarly, IED 132 may be configured to monitor distribution line 106 by obtaining current signals from CT 122, determining a condition of the electric power delivery system 100, and operating circuit breaker 116 based on the determined condition. As with IED 130, the IED 130 may also operate circuit breaker 116 based on a command from an HMI of IED 132, commands from supervisory systems, commands from other IEDs, and the like.

Furthermore, IED 134 may be configured to monitor and effect an operation on feeder 112. To that end, IED 134 may obtain voltage signals from the distribution bus 110 using PT 128, and current signals from the feeder 112 using CT 126. With the voltage and/or current signals, IED 134 may be configured to determine a condition of the electric power delivery system 100 and effect an operation by signaling circuit breaker 118 to open or close. For example, IED 134 may detect a fault on the feeder 112 by detecting an overcurrent condition using current signals from CT 126, and, based on the overcurrent condition, signal circuit breaker 118 to open, thus removing electric energy from feeding the fault. As with IEDs 130 and 132, IED 134 may also operate circuit breaker 118 based on a command from an HMI of IED 134, commands from supervisory systems, commands from other IEDs, and the like.

As mentioned above, IEDs 130, 132, and 134 may include an HMI with buttons dedicated to a particular operation. For example, IEDs 130, 132, and 134 may include an open button that when depressed signals an associated circuit breaker to open, and a close button that when depressed signals an associated circuit breaker to close. IEDs 130, 132, and 134 may also include configurable operation buttons that may be configured with a desired operation by a user, that when depressed effect the configured operation. Configurable operation buttons may effect an operation using a processor of the IED. That is, depression of the configurable operation buttons may cause the processor to act on the signal and perform the operation. In various embodiments, dedicated operation buttons may not require processing to effect the operation. That is, according to some embodiments herein, depression of a dedicated operation button may directly signal an output without being first processed by a processor. It should be noted that depression of a dedicated operation button may also signal a processor, but processing of a signal by the processor may not be required for the IED to signal the equipment to undertake the dedicated operation.

Figure 2:
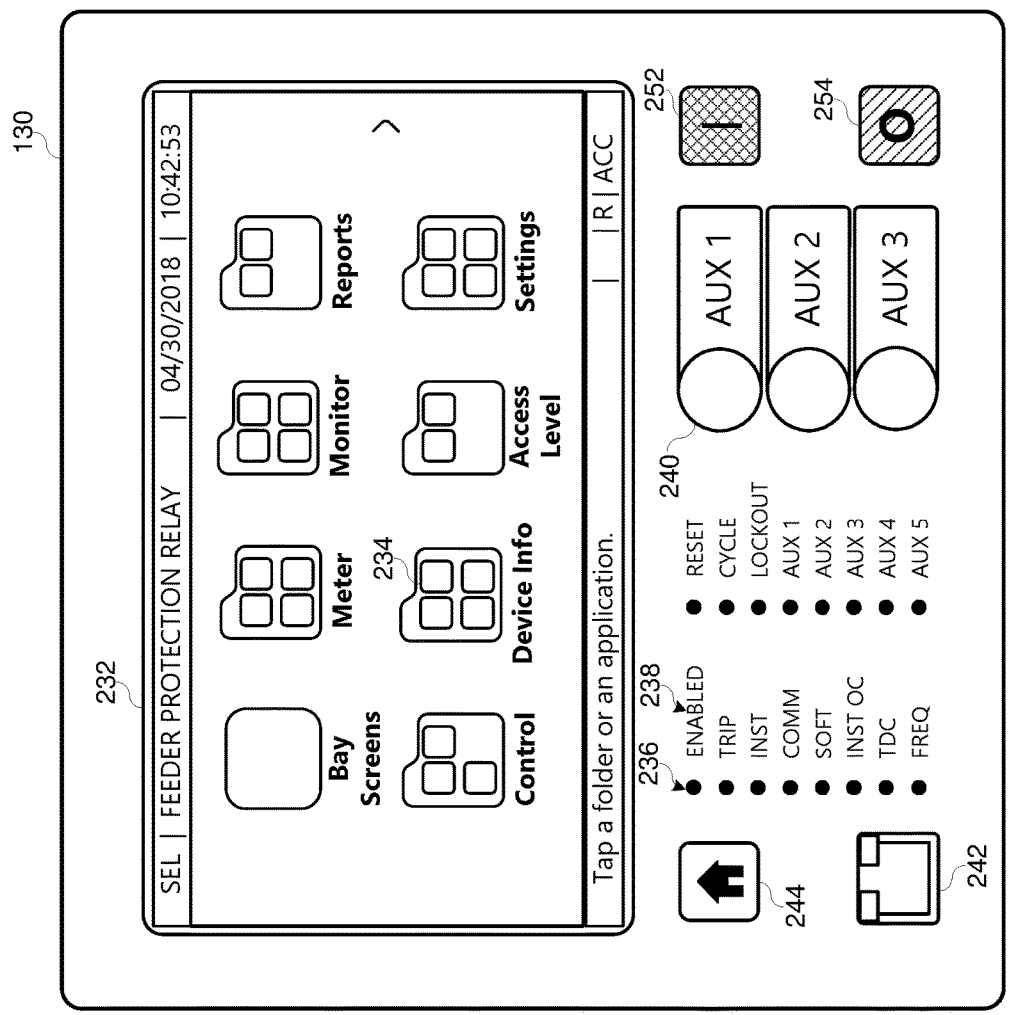
FIG. 2 illustrates a front view of a monitoring device for an electric power delivery system with adaptable control apparatus indicators in a first user configuration.

FIG. 2 illustrates a front view of an IED 130 in accordance with several embodiments herein. The front view includes an HMI that may be visible to and usable by an operator to configure and operate the IED 130. The HMI may include a first display 232 that may include a screen, touch screen, LCD display, or the like. The display 232 may include various representations of operations, settings, and statuses of the IED and monitored equipment. The display 232 may be usable for interacting with the IED to effect configuration, operations, information display, and the like. For example, the display 232 as illustrated may include a touch-sensitive screen with folders of various grouped icons. The folders may be selected by touch or other input to explore the applications included therein. Once the folder is selected, the applications may be selected to open different available operations of the IED.

For example, the groups may include device information 234. When selected, the device information 234 group may display a number of different icons associated with available applications corresponding with device information. Some of the available applications under the device information folder 234 include status of the IED, configuration of the IED, reboot, arc-flash diagnostics, trip and diagnostic messages, and the like. The bay screens folder may include different available one-line diagrams of bay configurations that may be monitored by the IED. A control folder may include different control applications such as breaker control, output pulsing, local bits, and the like. In addition to interacting with the configuration and operation of IED 130 using the display 232, the HMI may include a home button 244 that when depressed, causes the display 232 to return to the home screen that includes the various folders of applications.

The HMI may also include various indicators 236 associated with different targets 238. When the target is active, the associated indicator may be illuminated to alert an operator that the target is active. For example, when the IED 130 has sent a trip command to a circuit breaker, the "TRIP" target is active, and the indicator associated with "TRIP" is illuminated.

As briefly mentioned above, the IED may include various configurable operation buttons such as button 240. The configurable operation buttons may correspond with a configured operation such that when the button 240 is depressed, the IED undertakes the configured operation. The configurable operation buttons may be configured to associate with a user-defined operation upon commissioning of the IED. For example, an operator may select an appropriate application from a folder on the display 232 to associate the particular configurable operation button with a configurable operation. Alternatively, a setting application may be executed on a separate device (such as a laptop computer or the like) in communication with the IED 130 via communications port 242. The setting application may be used to associate the configurable operation button with a desired configurable operation.

The IED 130 may include communications port 242 such as, for example, an RJ45 port, a serial port, a USB port, or the like. The communications port 242 may be operable for a user to connect a separate device (such as a laptop computer, or the like) to the IED 130 to perform certain operations on the IED 130. In various embodiments, the communications port 242 may be used for obtaining information from IED 130. In some embodiments the communications port 242 may be used to apply settings or configuration to the IED 130. For example, the connected device may execute a settings application such as, for example, AcSELerator® settings software available from Schweitzer Engineering Laboratories, Inc. in Pullman, Wash. The settings application may be used by an operator to select settings, configure operations associated with the configurable operation buttons, create bay screens, and the like, and upload such settings and configurations to the IED 130.

IED 130 also includes a plurality of dedicated operation buttons with adaptable indicators 252, 254. As discussed above, the dedicated operation buttons 252, 254 are configured to signal a dedicated operation upon depression. For example, dedicated operation button 252 may be configured to signal a circuit breaker to close (i.e. the dedicated operation associated with button 252 is a close signal to a circuit breaker) when depressed; and dedicated operation button 254 may be configured to signal a circuit breaker to open (i.e. the dedicated operation associated with button 254 is an open signal to the circuit breaker) when depressed. Accordingly, the buttons may be referred to as a close button 252 and an open button 254, or buttons with dedicated operations of closing and opening. Similarly, if the switch or circuit breaker is in electrical communication with a motor for applying and removing a supply of electric power to and from the motor, then the buttons may be referred to as a start button 252 and a stop button 254. Although the various embodiments presented herein may refer to dedicate operations of open and close when referring to buttons 252 and 254, it should be understood that any dedicated operation may be associated with the buttons such as, for example, starting and stopping a motor, tapping up and tapping down a voltage regulator, connecting and disconnecting a capacitor bank, closing and opening a communication channel, locking and unlocking a mechanical lock, and the like. The dedicated operations of buttons 252 and 254 may not be configurable. That is, regardless of the configuration or setting of the IED, upon depression of button 252, a first signal will be instigated to cause the first dedicated action (e.g., in one embodiment, a close signal will be instigated to the circuit breaker), and upon depression of button 254, a second signal will be instigated to cause the second dedicated action (e.g. in one embodiment, an open signal will be instigated to the circuit breaker).

Figure 3:
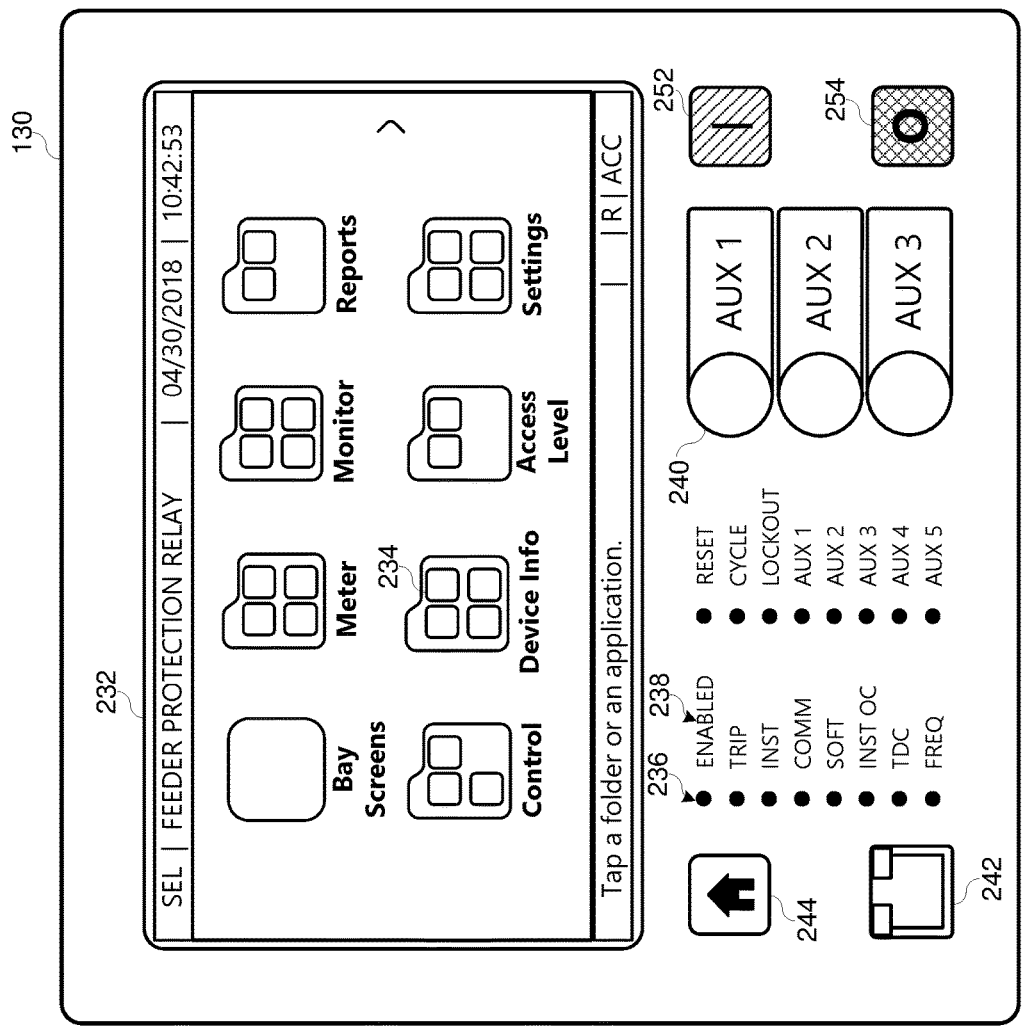
FIG. 3 illustrates a front view of a monitoring device for an electric power delivery system with adaptable control apparatus indicators in a second user configuration.

The colors of the dedicated operation buttons 252 and 254 may be governed by the particular customer or installation of the IED 130. In certain installations, the close button 252 may be required to be green, and the open button 254 may be required to be red. In other installations, the close button 252 may be required to be red, and the open button 254 may be required to be green. According to several embodiments herein, a display associated with the dedicated operation buttons 252, 254 may be configurable such that the dedicated operation buttons 252, 254 are illuminated with a color as configured by the user. As illustrated, close button 252 displays a first color, and open button 254 displays a second color. Similarly, FIG. 3 illustrates a front view of the IED 130 similar to FIG. 2, except that close button 252 displays the second color, and open button 254 displays the first color.

The associated colors may be configured by a user. In one embodiment, the colors associated with the dedicated operation buttons 252, 254 may be configured using the display 232. For example, a user may select the "settings" application within the "Device Info" folder 234. Within the available settings may be an option to select a color for each of the dedicated operation buttons 252, 254. Upon selecting the colors for each of the dedicated operation buttons 252, 254, a processor of the IED 130 may be configured to cause the dedicated operation buttons 252, 254 to display the selected colors. In one embodiment, the "settings" application may include a line for the close button 252 with a pull-down option that displays the available colors. The user may then select the desired color for the close button 252. Further, the "settings" application may include a line for the open button 254 with a pull-down option that displays the available colors. The user may then select the desired color for the open button 254.

In another embodiment, the colors of the dedicated operation buttons 252, 254 may be configurable using a settings application operating on a separate device in communication with the IED 130 via the communications port 242. The settings application may include options for different color displays for the dedicated operation buttons 252, 254 that may be selected by a user and loaded to the IED 130 at configuration time.

In certain embodiments, the adaptability of color of the dedicated operation buttons 252, 254 may only be changed at configuration time. That is, once the IED 130 is in service, the colors associated with the dedicated operation buttons 252, 254 cannot be modified. In other embodiments, the setting of the colors associated with the dedicated operation buttons 252, 254 may only be available upon entering a predetermined level of security. That is, security credentials may be required to be entered before the colors associated with the dedicated operation buttons 252, 254 may be set or changed. IEDs may be configured with various levels of access or security associated with the different roles of anticipated users of the IEDs. Different activities available to users of the IED may be available only under certain access levels. Changing the colors of the dedicated operation buttons 252, 254 may be an activity that is only available under predetermined access levels.

In several embodiments, the dedicated operation buttons 252, 254 may include physical separate buttons mounted on the IED 130. In other embodiments, the dedicated operation buttons 252, 254 may include depression buttons positioned under a common front surface such that depression of the dedicated operation buttons 252, 254 may be effected by a user pressing on the common front surface in the area of the dedicated operation button. The common front surface may include markings indicating the positions of the dedicated operation buttons. The common front surface may include a tactile differentiation (such as a raised or blistered surface, change in texture, or the like) indicating the positions of the dedicated operation buttons.

Figure 4A:
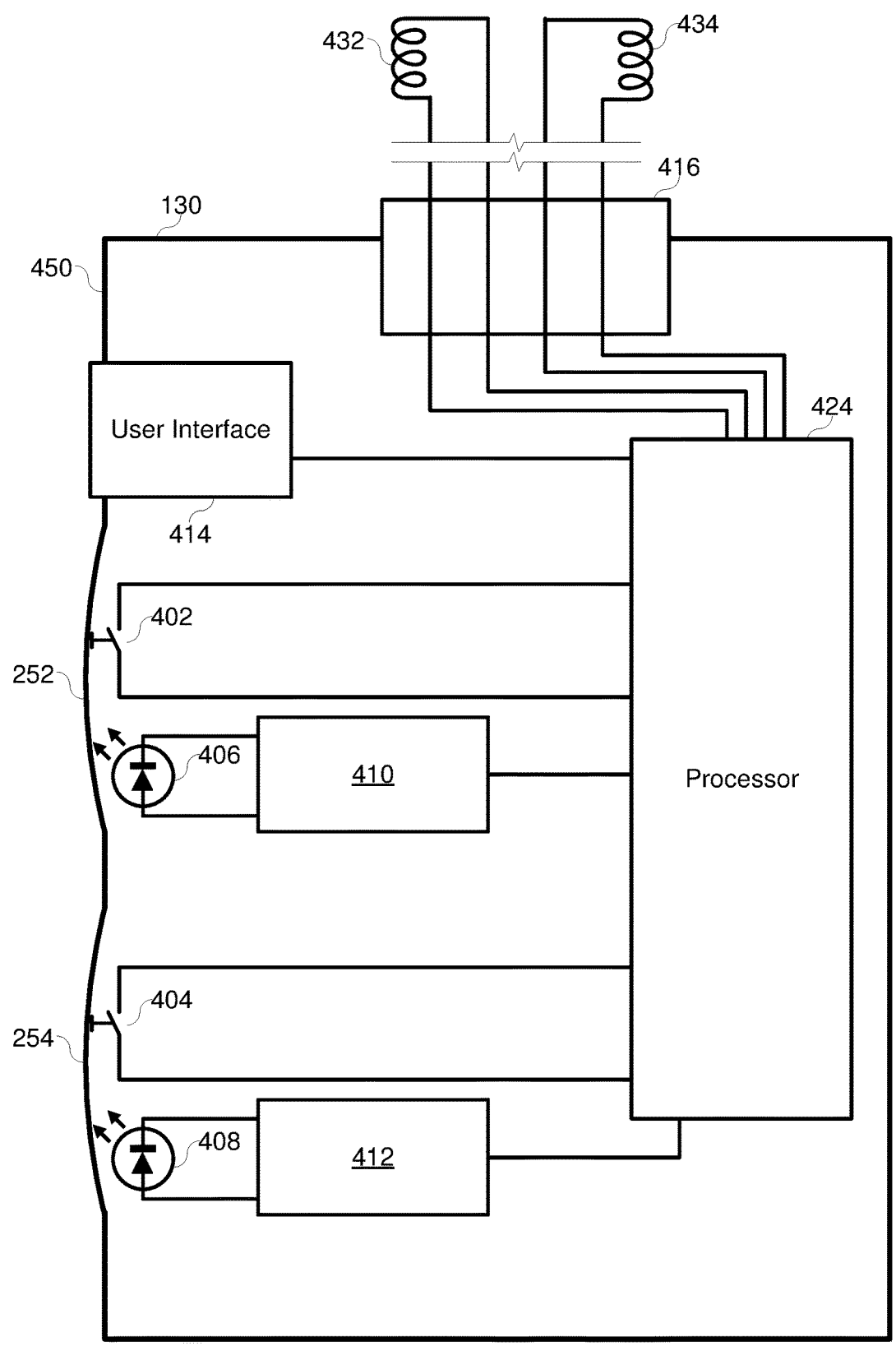
FIGS. 4A and 4B illustrate simplified block diagrams of a monitoring device including adaptable control apparatus indicators.

FIG. 4A illustrates a simplified block diagram of an IED 130 that includes dedicated operation buttons 252, 254 with adaptable display disposed on a face 450 of the IED 130 in accordance with several embodiments discussed herein. IED 130 may include a processor 424 that may be configured, receive signals, perform monitoring operations, and operate the IED in accordance with several embodiments described in more detail herein. The IED includes a user interface 414 that may include features similar to those discussed in conjunction with the HMI as discussed above. The user interface 414 may be in communication with the processor such that the processor controls various displays and outputs of the HMI, and the actions taken using the HMI are communicated to the processor.

The IED 130 also includes dedicated operation buttons such as close button 252 and open button 254. As illustrated, the dedicated operation buttons are configured behind a common surface or membrane of the IED 130 on a common face 450 of the IED 130. In various embodiments the buttons 252, 254 may be disposed on a common face with a user interface 414. The dedicated operation buttons are positioned behind raised surfaces which may include indications of the button or its operation. For example, the close button 252 may include an outline and an "I" indication, where the open button 254 may include an outline and an "0" indication.

The surfaces defining the dedicated operation buttons may be transparent or sufficiently transparent such that an illumination may be transmitted through the surface. In one embodiment the areas within the outlines of the dedicated operation buttons may be transparent. In another embodiment, the areas within the outlines of the dedicated operation buttons may be semi-transparent.

Positioned behind the surfaces defining the dedicated operation buttons 252, 254 may be hardware for emitting an illumination of a color associated with the dedicated operation of the button, or for presenting a surface with a color or gradient according to a user selected configuration. As illustrated, the close button 252 includes a light emitting diode (LED) 406 housed behind the close button surface. The LED 406 may be in communication with an LED circuit 410 configured to provide electric power to LED 406 at a level associated with the color associated with close button 252. The LED circuit 410 may be controlled by the processor 424. Similarly, the open button 254 includes a light emitting diode (LED) 408 housed behind the open button surface. The LED 408 may be in communication with an LED circuit 412 configured to provide electric power to LED 408 at a level associated with the color associated with open button 254. The LED circuit 412 may be controlled by the processor 424.

Although several embodiments as described herein include an LED to provide illumination of a color for the buttons, various different hardware may be used to adapt the indicators of the buttons. In one embodiment, different colored incandescent lights may be used to illuminate the buttons with different colors. In another embodiment, the buttons 252, 254 may comprise a surface with an electronic paper (or e-ink) display that may be configured between dark, light, or different colors.

In one embodiment, the close button 252 may be configured as green via setting as described in more detail above. Accordingly, the processor 424 may signal the LED circuitry 410 to provide electric power to LED 406 at a level associated with the green color. Accordingly, LED 406 will emit light in the spectrum of green, directed at the surface of close button 252 such that the light is emitted through the transparent or semi-transparent portion of the surface, so that the close button 252 appears to be green. Similarly, the open button 254 may be configured as red via setting as described in more detail above. Accordingly, the processor 424 may signal the LED circuitry 412 to provide electric power to LED 408 at a level associated with the red color. Accordingly, LED 408 will emit light in the spectrum of red, directed at the surface of open button 254 such that the light is emitted through the transparent or semi-transparent portion of the surface, so that the open button 254 appears to be red.

As discussed above, the IED 130 may be configured with alternative settings such that the dedicated operation buttons 252, 254 appear as other colors due to the emission of colored light.

Although the described embodiment uses LEDs, other hardware capable of producing different colored light may be used in place of LEDs. Furthermore, the control circuitry 410, 412 may be a single control circuitry to control both LEDs 406, 408; may be part of other modules within the IED 130; or the like. Although not separately illustrated, a power source may be in communication with the control circuitry 410, 412 to supply the electric power to the circuitry and the LEDs.

Furthermore, the dedicated operation buttons 252, 254 may be configured as separate physical buttons disposed on the IED 130 instead of as described in the illustrated embodiment. In such embodiments, the LEDs and control circuitry may be part of the separate physical buttons, or may be as illustrated.

In order to effect the dedicated operations, the dedicated operation buttons 252, 254 each include a switch 402, 404 to provide a signal that is used to effect the dedicated operation. For example, the open button 254 may include switch 404 configured to provide a signal to the processor 424. The signal may be provided by closing a circuit upon depression of open button 254. Upon receipt of the signal from switch 404, the processor may be configured to provide a signal to primary equipment. As illustrated the signal may be a trip (or open) signal. The open signal may be provided to a circuit breaker using equipment interface 416. The open signal may be provided by supplying a current through trip coil 432 used by the circuit breaker to open the circuit breaker contact. Although not separately illustrated, the IED 130 may include additional circuitry to provide the open signal current through the trip coil 432.

Further, the close button 252 may include switch 402 configured to provide a signal to the processor 424. The signal may be provided by closing a circuit upon depression of close button 252. Upon receipt of the signal from switch 402, the processor may be configured to provide a signal to primary equipment. As illustrated the signal may be a close signal. The close signal may be provided to a circuit breaker using equipment interface 416. The close signal may be provided by supplying a current through close coil 434 used by the circuit breaker to close the circuit breaker contact. Although not separately illustrated, the IED 130 may include additional circuitry to provide the close signal current through the trip coil 432.

Figure 4B:
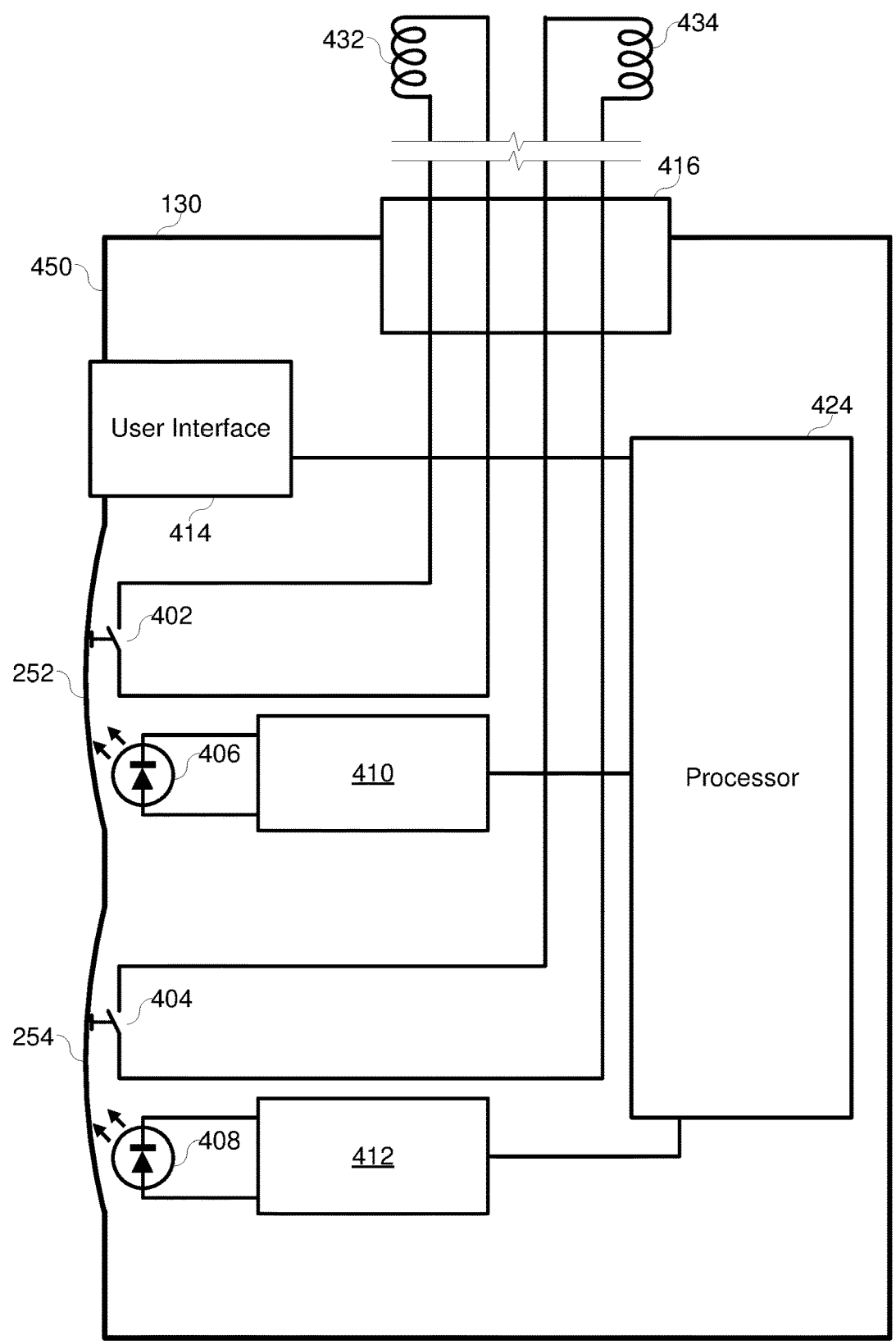

In certain embodiments, the IED 130 may be configured such that the signals to operate the circuit breaker do not need to be processed by the processor. FIG. 4B illustrates a simplified block diagram of an IED that includes dedicated function open and close buttons 254, 252 in accordance with several embodiments herein with adaptable indicators configured to effect the dedicated function without need of processing a signal to effect the dedicated function. Open button 254 may be configured with a switch 404. Upon depression of open button 254, the switch 404 closes, which closes a circuit and energizes trip coil 434 via the equipment interface 416. Although not separately illustrated, the trip circuit may include a power source to provide electric power to the trip coil 434 upon closing of the switch 404. Accordingly, the dedicated operation of a trip (or open) may be effected by depressing button 254 even without signaling the processor 424.

Similarly, close button 252 may be configured with a switch 402. Upon depression of close button 252, the switch 402 closes, which closes a circuit and energizes open coil 432 via the equipment interface 416. Although not separately illustrated, the open circuit may include a power source to provide electric power to the open coil 434 upon closing of the switch 402. Accordingly, the dedicated operation closing a circuit breaker may be effected by depressing button 252 even without signaling the processor 424.

In various embodiments, the processor may be configured to alter the indicators of the dedicated control buttons upon activation of the button or upon completion of an operation. Upon depression of the open button 252, the processor 424 may receive a signal indicating that the open button 252 has been depressed. The processor may signal controller 410 to modify the color, intensity, or timing of light emitted by diode 406. Further, upon effecting the dedicated operation, the processor 424 may receive a signal from the equipment interface 416, and signal controller 410 to modify the color, intensity, or timing of light emitted by diode 406. Similar actions may be performed upon depression of close button 254 and/or operation of the dedicated operation after depression of the close button 254.

In one embodiment, the processor may signal controller 410 to blink upon depression of the open button 252. Such blinking may continue while the completion of the operation is pending, and stop after completion of the operation. For example, if the operation is an opening of a circuit breaker, the indicator may blink upon depression of the button, and stop blinking (either turn off or return to a single steady color) upon completion of the opening of the breaker. Similarly, if the operation is the starting of the motor, the button may blink upon depression, and continue blinking until the motor is started. In certain embodiments, the IED may be configured with a time delay for dedicated operations. The processor may be configured to signal the indicator to blink upon depression, and through the time delay, until the operation. For example, the IED may be configured to delay a start of a motor for 20 seconds. Upon depression of the button corresponding with the starting of the motor, the controller 410 may cause the LED 406 to blink during the 20 second delay, and, upon signaling the motor to start, may cause the LED 406 to stop blinking.

In one embodiment, the processor may signal controller 410 to increase intensity of the LED 406 upon opening of the circuit breaker. Various combinations of colors, intensities, timings, and the like may be used to signal operations upon depression of the open and/or close buttons.

In certain embodiments, the IED may be configured such that the buttons indicate when their function is disabled. For example, when the dedicated operation of the button is not available, the indicator may be configured to be dark or not illuminated (e.g. LED 410 is off). This may be helpful to indicate to a user that the dedicated operation is not available. For example, after depressing the trip (open) button 254, controller 412 may be configured to turn off LED 408, indicating that the circuit breaker is open, and the dedicated operation of trip (or open) is not available. Accordingly, a user would have a visual indication that the circuit breaker is open. Further, if the IED has operated the circuit breaker to open even without depression of the trip (or open) button 254, the controller 412 may be configured to turn off LED 408 to indicate that the dedicated operation of trip (or open) is not available, because the circuit breaker is already open.

Figure 5:
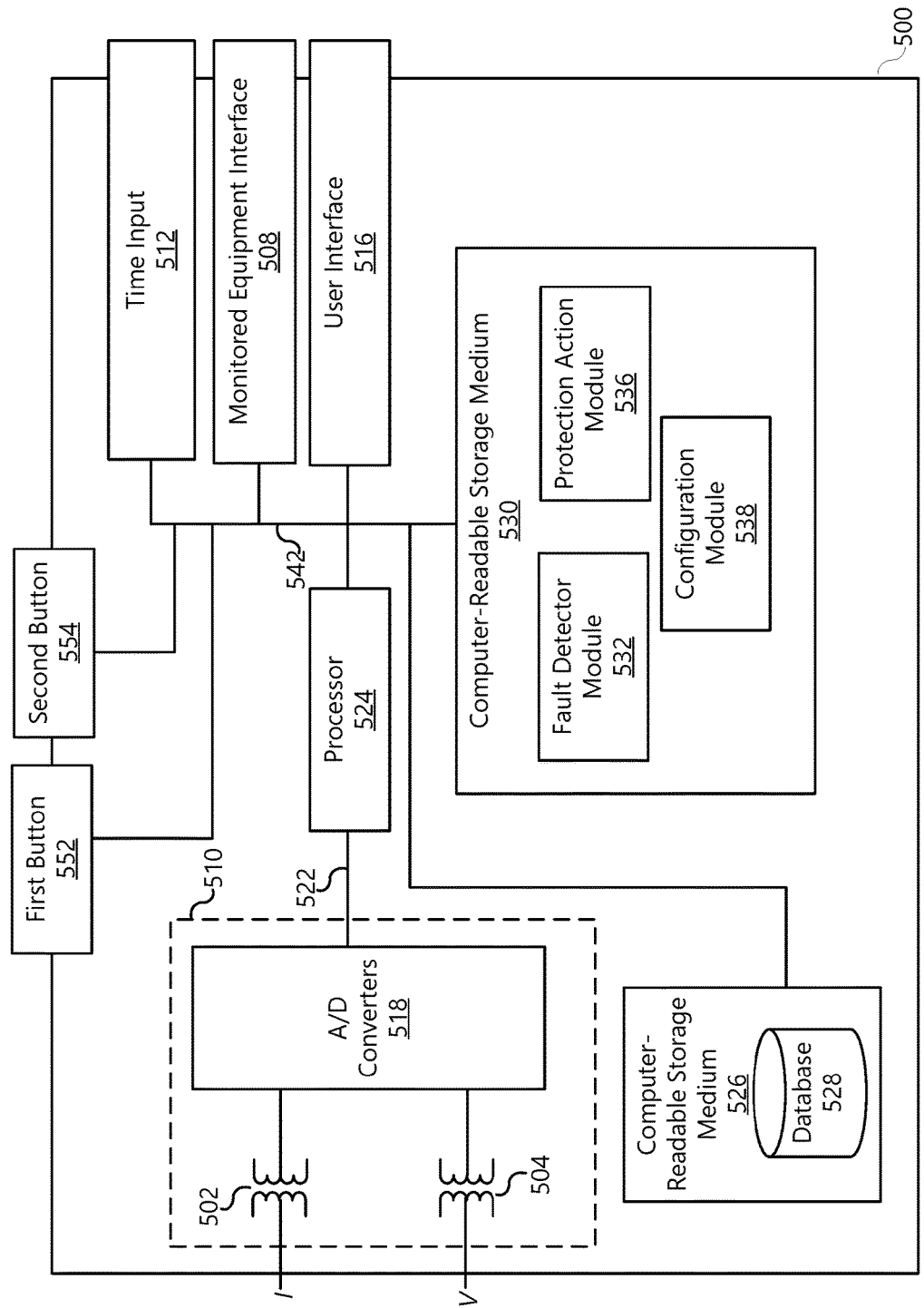
FIG. 5 illustrates a simplified block diagram of a monitoring device in accordance with several embodiments described herein.

FIG. 5 illustrates a simplified block diagram of a monitoring device 500 in accordance with several embodiments herein. The monitoring device 500 includes an input 510 for obtaining equipment signals from monitored equipment. As illustrated, the input 510 is configured to obtain current and voltage signals from the monitored equipment. Various other information may be obtained from different inputs such as open/closed status, frequency, temperature, level, composition, or the like. As illustrated, the input includes transformers 502 and 504 for stepping the obtained voltage and current signals to an acceptable level for use by an analog-to-digital (A/D) converter 518. The A/D converter 518 may sample and digitize the signals from transformers 502, 504 to provide digitized analog signals 522 to the processor 524.

Data bus 542 may be in communication with, and facilitate data transfer among the processor 524, computer-readable storage media 526, 530, first and second buttons 552, 554, time input 512, monitored equipment interface 508, user interface 516, and others. Data bus 542 may include one or more data buses not separately illustrated.

The first and second buttons 552, 554 are representative of the buttons described in more detail herein. First and second buttons 552, 554, may include the controllers, light-emitting devices, color change devices, switches, surfaces, and the like as described in more detail herein, though not separately illustrated, and may include connections to other parts of the IED 500 that are not separately illustrated in this figure.

IED 500 may include a time input 512 for receiving a time signal such as a common time signal that may be used for various operations of the IED 500. Monitored equipment interface 508 may be in communication with the monitored equipment as described hereinabove to provide signals to operate the monitored equipment (e.g. circuit breaker, switch, or the like). The user interface 516 may be used by a user to provide configuration inputs to the IED 500 including, among others, configuration of the adaptable displays associated with the first and second buttons 552, 554. A first computer-readable storage medium 526 may include a database 528 for storing various data such as, for example, the configuration provided by the user via the user interface 516.

Computer-readable storage medium 530 may be a repository of computer instructions that, when executed by the processor 524 cause the IED 500 to perform functions. For example, the fault detector module 532 may include computer instructions that, when executed, cause the IED to receive signals (such as voltage and/or current) from the input 510, and determine if an event such as a fault has occurred. The fault detector module 532 may include instructions for determining a direction to a fault, a distance to a fault, a fault magnitude, or the like. Upon determining a fault, the protection action module 536 may be executed to use the fault information to determine a protective action to take. For example, the protection action module 536 may use the fault magnitude and/or the direction to the fault to determine that a protective trip action must be taken, and cause the processor to signal the monitored equipment interface 508 to provide a trip signal to the monitored equipment. It should be understood that many different modules may be provided in the computer-readable storage medium depending on the intended functions of the IED 500. Furthermore, although the different modules are illustrated as separate modules, the functions may be provided in the same or different blocks of instructions, stored on the same or different media.

The configuration module 538 may include instructions that when executed allow for configuration of the IED 500. Configuration may simply include receipt of configuration settings from another device using a communications interface, and applying those settings to the IED 500. Specifically related to the embodiments herein, a user may use another device to configure the desired indications related to the first and second buttons 552 and 554, and transmit those configurations to the IED 500. The configuration module 538 may be executed to receive those configurations and apply those configurations. For example, a user may execute setting software such as AcSELerator® software on a laptop computer, setting the color of green for the first button 552 and the color of red for the second button 554, along with a flashing pattern upon depression of either button, and a time delay of 20 seconds upon depression of the first button 552 before the IED 500 may take the dedicated action associated with the first button 552. Upon connection of the laptop with the IED 500, such settings may be transmitted to the IED. The configuration module 538 may be executed to establish such configuration, resulting in the LEDs of the first and second buttons 552, 554 to emit the configured colors and patterns, and resulting in the configured time delay.

Configuration may include execution of configuration routines using the user interface 516 and receipt of user input using the user interface 516. Specifically related to the embodiments herein, a touchscreen or other user interface of the IED 500 may be used to display various options to the user, and receive various configuration commands from the user. The user may, therefore, use the user interface 516 to provide specific color settings for the first and second buttons 552, 554, flashing patterns, time delays, and the like. The configuration module 538 may then cause the processor to establish such configuration, resulting in the appropriate colors and flashing patterns of buttons 552, 554, and time delays before executing the dedicated actions associated with the first and second buttons 552, 554.

Furthermore, it should be understood that, although the processor 524 and computer media 526, 530 are illustrated as separate, they may be provided on the same unit or chip, or may be further separated among many different pieces of computer-readable media.

Accordingly, described herein are adaptable control apparatus indicators for an electric power delivery system. The adaptable control apparatus indicators may be integrated in or disposed on dedicated operation buttons of an IED. The adaptable control apparatus indicators may be configurable by an operator or user during configuration of the IED.

While specific embodiments and applications of the disclosure have been illustrated and described, it is to be understood that the disclosure is not limited to the precise configurations and components disclosed herein Accordingly, many changes may be made to the details of the above-described embodiments without departing from the underlying principles of this disclosure. The scope of the present invention should, therefore, be determined only by the following claims.

What is claimed is:

1. A device for protecting an electric power delivery system, comprising:
   an input in electrical communication with the electric power delivery system and obtaining electric power system signals therefrom;
   an equipment interface in communication with electric power system equipment configured to:
      effect an open operation of a circuit of the electric power delivery system in response to an open command by sending an open signal to the electric power system equipment; and,
      effect a close operation of the circuit in response to a close command by sending a close signal to the electric power system equipment;
   a first button disposed on a face of the device for effecting the open operation on the electric power delivery system, comprising:
      a first depression surface;
      a first switch in communication with the first depression surface operable upon depression of the first depression surface to provide the open command; and
      a first programmable light source configured to emit a first color of light through the first depression surface, the first color selected by a user upon configuration of the device;
   a second button disposed on the face of the device for effecting the close operation on the electric power delivery system, comprising:
      a second depression surface;
      a second switch in communication with the second depression surface operable upon depression of the second depression surface to provide the close command; and,
      a second programmable light source configured to emit a second color of light through the second depression surface, the second color selected by the user upon configuration of the device; and,
   a processor in communication with the input, the first programmable light source, and the second programmable light source, configured to receive a color command from the user and signal the first programmable light source to emit the first color in response to the color command and signal the second light source to emit the second color in response to the color command.

2. The device of claim 1, wherein the electric power system equipment comprises a circuit breaker configured to open the circuit in response to the open signal and close the circuit in response to the close signal.

3. The device of claim 1, wherein the first color comprises red and the second color comprises green.

4. The device of claim 1, wherein the open operation is effected without processing of the open command by the processor.

5. The device of claim 1, wherein the first button is configured to signal the processor to effect the open operation.

6. The device of claim 1, wherein the first light source comprises a light-emitting diode.

7. The device of claim 1, wherein the first light source comprises an e-ink display.

8. The device of claim 1, wherein the processor is further configured to signal the first light source to modify the first color after depression of the first button.

9. A device for controlling an operation of equipment, comprising:
an input in electrical communication with the equipment obtaining operational signals therefrom;
an equipment interface in communication with the equipment configured to:
effect a first dedicated operation by sending a first signal to the equipment to cause the equipment to perform the first dedicated operation; and,
effect a second dedicated operation by sending a second signal to the equipment to cause the equipment to perform the second dedicated operation;
a first button disposed on a face of the device for effecting the first dedicated operation, comprising:
a first depression surface;
a first switch in communication with the first depression surface operable upon depression of the first depression surface signals the equipment interface to send the first signal to the equipment to perform the first dedicated operation; and
a first programmable light source configured to emit a first color of light through the first depression surface, the first color selected by a user upon configuration of the device;
a second button disposed on the face of the device for effecting the second dedicated operation, comprising:
a second depression surface;
a second switch in communication with the second depression surface operable upon depression of the second depression surface signals the equipment interface to send the second signal to the equipment to perform the second dedicated operation; and
a second programmable light source configured to emit a second color of light through the second depression surface, the second color selected by the user upon configuration of the device; and
a processor in communication with the input and the equipment interface configured to receive a color command from the user and signal the first light source to emit the first color in response to the color command and signal the second light source to emit the second color in response to the color command.

10. The device of claim 9, wherein
the equipment comprises a circuit breaker;
the first dedicated operation comprises opening the circuit breaker; and
the second dedicated operation comprises closing the circuit breaker.

11. The device of claim 9, wherein the first color comprises red and the second color comprises green.

12. The device of claim 9, wherein the first dedicated operation is effected without processing of a signal from the first button by the processor.

13. The device of claim 9, wherein the first button is configured to signal the processor to effect the first dedicated operation.

14. The device of claim 9, wherein the first programmable light source comprises a light-emitting diode.

15. The device of claim 9, wherein the first programmable light source comprises an e-ink display.

16. The device of claim 9, wherein the processor is further configured to signal the first light source to modify the first color after depression of the first button.

17. The device of claim 16, wherein the modification of the first color comprises modification of intensity.

18. The device of claim 16, wherein the modification of the first color comprises flashing of the first color.

19. The device of claim 9, wherein the first dedicated operation comprises starting a motor and the second dedicated operation comprises stopping a motor.

20. The device of claim 9, wherein the processor is further configured to signal the first light source to modify the emission of the first color upon depression of the first depression surface until completion of the first dedicated operation.

* * * * *